(12) United States Patent
Kim et al.

(10) Patent No.: US 9,590,121 B2
(45) Date of Patent: Mar. 7, 2017

(54) OPTOELECTRONIC DEVICE, AND IMAGE SENSOR AND ELECTRONIC DEVICE INCLUDING THE SAME

(71) Applicant: Samsung Electronics Co., Ltd., Suwon-si, Gyeonggi-do (KR)

(72) Inventors: Seong Heon Kim, Seongnam-si (KR); Dongjin Yun, Pohang-si (KR); Sung Heo, Suwon-si (KR); Kyu Sik Kim, Yongin-si (KR); Satoh Ryuichi, Numazu-si (JP); Gyeongsu Park, Hwaseong-si (KR); Hyung-Ik Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/744,938

(22) Filed: Jun. 19, 2015

(65) Prior Publication Data
US 2016/0233351 A1    Aug. 11, 2016

(30) Foreign Application Priority Data

Feb. 5, 2015    (KR) .................. 10-2015-0018230

(51) Int. Cl.
*H01L 27/146*    (2006.01)
*H01L 31/0224*   (2006.01)
(Continued)

(52) U.S. Cl.
CPC ...... *H01L 31/022408* (2013.01); *H01L 31/18* (2013.01); *H01L 51/4253* (2013.01); *H01L 51/0046* (2013.01); *H01L 51/0077* (2013.01)

(58) Field of Classification Search
CPC ............. H01L 31/022408; H01L 31/18; H01L 27/14636
See application file for complete search history.

(56) References Cited

U.S. PATENT DOCUMENTS

| 7,990,049 B2 | 8/2011 | Shioya |
| 2009/0072723 A1* | 3/2009 | Shioya ................ H01L 51/5088 313/504 |

(Continued)

FOREIGN PATENT DOCUMENTS

| KR | 20110119710 A | 11/2011 |
| KR | 20140024013 A | 2/2014 |
| WO | WO-2014021177 A1 | 2/2014 |

OTHER PUBLICATIONS

Katsuyuki Morii, "The role of $TiO_2$ in the air-stable hybrid organic-inorganic light-emitting diodes", Synthetic Metals, 2009, p. 2312-2314, Elsevier B.V.

(Continued)

*Primary Examiner* — Shaun Campbell
(74) *Attorney, Agent, or Firm* — Harness, Dickey & Pierce, P.L.C.

(57) ABSTRACT

An optoelectronic device includes a first electrode and a second electrode facing each other, a photoelectric conversion layer between the first electrode and the second electrode, and a buffer layer between at least one of the photoelectric conversion layer and the first electrode, and the photoelectric conversion layer and the second electrode, the buffer layer including one of $MoO_{x1}$ ($2.58 \leq x1 < 3.0$), $ZnO_{x2}$ ($1.0 \leq x2 < 2.0$), $TiO_{x3}$ ($1.5 \leq x3 < 2.0$), $VO_{x4}$ ($1.5 \leq x4 < 2.0$), $TaO_{x5}$ ($1.0 \leq x5 < 2.5$), $WO_{x6}$ ($2.0 < x6 < 3.0$), and a combination thereof.

17 Claims, 9 Drawing Sheets

(51) Int. Cl.
*H01L 31/18* (2006.01)
*H01L 51/42* (2006.01)
*H01L 51/00* (2006.01)

(56) References Cited

U.S. PATENT DOCUMENTS

| | | |
|---|---|---|
| 2011/0012091 A1 | 1/2011 | Forrest et al. |
| 2012/0018832 A1* | 1/2012 | Cooney, III ............ C23C 16/02 257/432 |
| 2012/0097250 A1 | 4/2012 | Klenkler et al. |
| 2012/0241723 A1 | 9/2012 | Klem et al. |
| 2014/0053897 A1 | 2/2014 | Balasubramanian et al. |
| 2014/0225063 A1 | 8/2014 | Klem et al. |
| 2014/0318609 A1* | 10/2014 | Martorell Pena ... H01L 51/4213 136/255 |
| 2015/0187843 A1* | 7/2015 | Hatano ............... H01L 27/1464 257/40 |

OTHER PUBLICATIONS

Li Ping Lu, Dinesh Kabra, and Richard H. Friend, "Barium Hydroxide as an Interlayer Between Zinc Oxide and a Luminescent Conjugated Polymer for Light-Emitting Diodes", Advanced Functional Materials, 2012, p. 4165-4171, WILEY-VCH Verlag GmbH & Co. KGaA.

* cited by examiner

OPTOELECTRONIC DEVICE, AND IMAGE SENSOR AND ELECTRONIC DEVICE INCLUDING THE SAME

CROSS REFERENCE TO RELATED APPLICATION

This application claims the benefit of priority from Korean Patent Application No. 10-2015-0018230 filed in the Korean Intellectual Property Office on Feb. 5, 2015, the entire contents of which are incorporated herein by reference.

BACKGROUND

1. Field

Example embodiments relate to an optoelectronic device, and an image sensor and an electronic device including the same.

2. Description of the Related Art

An optoelectronic device is a device requiring a charge exchange between an electrode and a photoelectric conversion layer by using holes or electrons.

An optoelectronic device may be classified as follows. A first optoelectronic device is an electronic device driven by generating excitons in a photoelectric conversion layer by photons from an external light source, separating the excitons into electrons and holes; and transferring the electrons and holes to different electrodes as a current source (voltage source). A second optoelectronic device is an electronic device driven by applying a voltage or a current to at least two electrodes to inject holes and/or electrons into a photoelectric conversion layer at an interface of the electrodes, and driving the device by the injected electrons and holes.

The optoelectronic device has a structure in which a photoelectric conversion layer including a functional inorganic or organic material is interposed between an anode and a cathode. The optoelectronic device may include a buffer layer (e.g., a hole injection layer (HIL), a hole transport layer (HTL), an electron transport layer (ETL), and an electron injection layer (EIL)) between an anode and a photoelectric conversion layer or a cathode and a photoelectric conversion layer, in order to improve efficiency and stability.

An organic optoelectronic device including a photoelectric conversion layer containing an organic material has relatively low external quantum efficiency in a visible light region and a relatively high dark current due to internal impurities in the organic material compared with an inorganic optoelectronic device including an inorganic oxide. The relatively high dark current may increase the leakage current of the organic optoelectronic device, and thus deteriorate the sensitivity of the organic optoelectronic device as well as accuracy of the external quantum efficiency converted from a photocurrent during the photoreaction.

Accordingly, development of an organic optoelectronic device capable of decreasing the dark current is needed.

SUMMARY

Example embodiments provide an optoelectronic device having improved sensitivity and performance by reducing dark current.

Example embodiments also provide a method of manufacturing the optoelectronic device.

Example embodiments also provide an image sensor having improved sensitivity and performance due to the optoelectronic device.

Example embodiments also provide an electronic device including the image sensor.

According to example embodiments, an optoelectronic device includes a first electrode and a second electrode facing each other, a photoelectric conversion layer between the first electrode and the second electrode, and a buffer layer between at least one of the photoelectric conversion layer and the first electrode, and the photoelectric conversion layer and the second electrode, the buffer layer including one of $MoO_{x1}$ ($2.58 \leq x1 < 3.0$), $ZnO_{x2}$ ($1.0 \leq x2 < 2.0$), $TiO_{x3}$ ($1.5 \leq x3 < 2.0$), $VO_{x4}$ ($1.5 \leq x4 < 2.0$), $TaO_{x5}$ ($1.0 \leq x5 < 2.5$), $WO_{x6}$ ($2.0 < x6 < 3.0$), and a combination thereof.

The buffer layer may include a first buffer layer between the photoelectric conversion layer and the first electrode and a second buffer layer between the photoelectric conversion layer and the second electrode, and each of the first buffer layer and the second buffer layer may independently include one of $MoO_{x1}$ ($2.62 \leq x_1 \leq 2.9$), $ZnO_{x2}$ ($1.0 \leq x_2 \leq 1.9$), $TiO_{x3}$ ($1.5 \leq x_3 \leq 1.9$), $VO_{x4}$ ($1.5 \leq x_4 \leq 1.9$), $TaO_{x5}$ ($1.0 \leq x_5 \leq 2.4$), $WO_{x6}$ ($2.1 \leq x_6 \leq 2.9$), and a combination thereof.

Each of the first buffer layer and the second buffer layer may have a thickness of about 1 nm to about 100 nm.

At least one of the first electrode and the second electrode may be a light-transmitting electrode.

The first electrode may include one of a first metal, a first metal oxide, and a combination thereof, and the second electrode may include one of a second metal, a second metal oxide, and a combination thereof.

According to example embodiments, a method of manufacturing a optoelectronic device includes forming a first buffer layer on a first electrode including depositing an inorganic oxide on the first electrode, the inorganic oxide including one of molybdenum oxide, zinc oxide, titanium oxide, vanadium oxide, tantalum oxide, tungsten oxide, and a combination thereof, and performing an oxygen plasma treatment on the resulting first electrode, and sequentially stacking a photoelectric conversion layer and a second electrode on the first buffer layer.

Prior to stacking the second electrode, the method may further include forming a second buffer layer on the photoelectric conversion layer including depositing an inorganic oxide on the photoelectric conversion layer, the inorganic oxide including one of molybdenum oxide, zinc oxide, titanium oxide, vanadium oxide, tantalum oxide, tungsten oxide, and a combination thereof, and performing an oxygen plasma treatment on the resulting photoelectric conversion layer.

According to example embodiments, a method of manufacturing an optoelectronic device includes forming a photoelectric conversion layer on a first electrode, forming a first buffer layer on the photoelectric conversion layer including depositing an inorganic oxide on the photoelectric conversion layer, the inorganic oxide including one of molybdenum oxide, zinc oxide, titanium oxide, vanadium oxide, tantalum oxide, tungsten oxide, and a combination thereof, and performing an oxygen plasma treatment on the resulting photoelectric conversion layer, and forming a second electrode on the first buffer layer.

The oxygen plasma treatment may be performed for about 30 seconds to about 3 hours. A gas flow rate of the oxygen plasma treatment may be adjusted in a range of about 10 sccm to about 200 sccm, and power supplied for the oxygen plasma treatment may be adjusted in a range of about 20 W to about 200 W.

The deposition process and the oxygen plasma treatment may be repeatedly at least once.

According to example embodiments, an image sensor includes the optoelectronic device.

The image sensor includes a semiconductor substrate integrated with a plurality of first photo-sensing devices sensing light in a blue wavelength region and a plurality of second photo-sensing devices sensing light in a red wavelength region and a third photo-sensing device on the semiconductor substrate and selectively absorbing light in a green wavelength region, wherein at least one of the plurality of first photo-sensing devices, the plurality of second photo-sensing devices and the third photo-sensing device may include the optoelectronic device.

The image sensor may further include a color filter layer between the semiconductor substrate and the third photo-sensing device, the color filter layer including a blue filter selectively absorbing light in the blue wavelength region and a red filter selectively absorbing light in the red wavelength region.

The plurality of first photo-sensing devices and the plurality of second photo-sensing devices may be stacked in a vertical direction on the semiconductor substrate.

A green photoelectric device selectively absorbing light in a green wavelength region, a blue photoelectric device selectively absorbing light in a blue wavelength region, and a red photoelectric device selectively absorbing light in a red wavelength region may be stacked.

According to example embodiments, an electronic device includes the image sensor.

DETAILED DESCRIPTION

Figure 1:
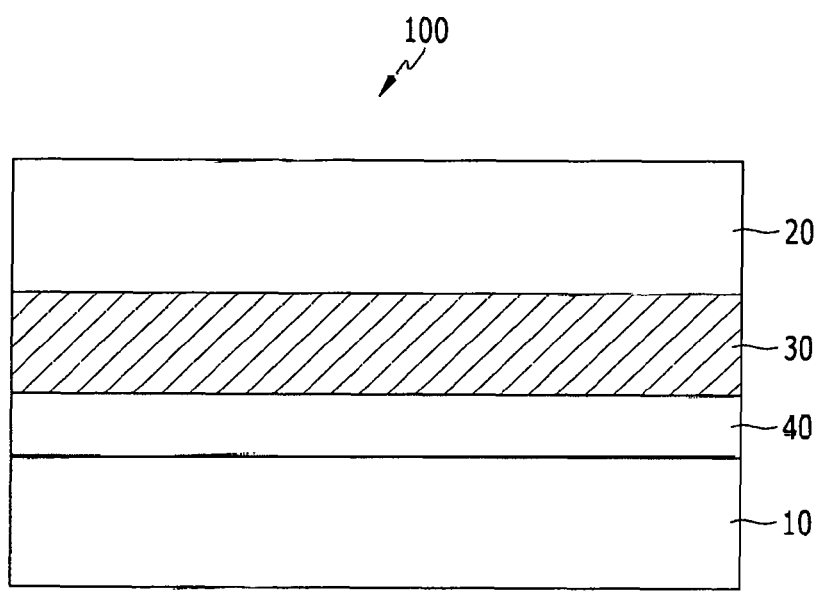
FIG. 1 is a cross-sectional view showing an optoelectronic device according to example embodiments.

Example embodiments will hereinafter be described in detail, and may be more easily performed by those who have common knowledge in the related art. However, this disclosure may be embodied in many different forms and is not to be construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that when an element or layer is referred to as being "on," "connected to," "coupled to," or "covering" another element or layer, it may be directly on, connected to, coupled to, or covering the other element or layer, or intervening elements or layers may be present. In contrast, when an element is referred to as being "directly on," "directly connected to," or "directly coupled to" another element or layer, there are no intervening elements or layers present. Like numbers refer to like elements throughout the specification. As used herein, the term "and/or" includes any and all combinations of one or more of the associated listed items.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the example embodiments.

Spatially relative terms, e.g., "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of the example embodiments. As used herein, the singular forms "a," "an," and "the" are intended to include the plural forms as well, unless the context clearly indicates otherwise. It will be further understood that the terms "comprises," "comprising," "includes," and/or "including," if used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Hereinafter, an optoelectronic device according to example embodiments is described referring to FIGS. 1 to 3.

Figure 2:
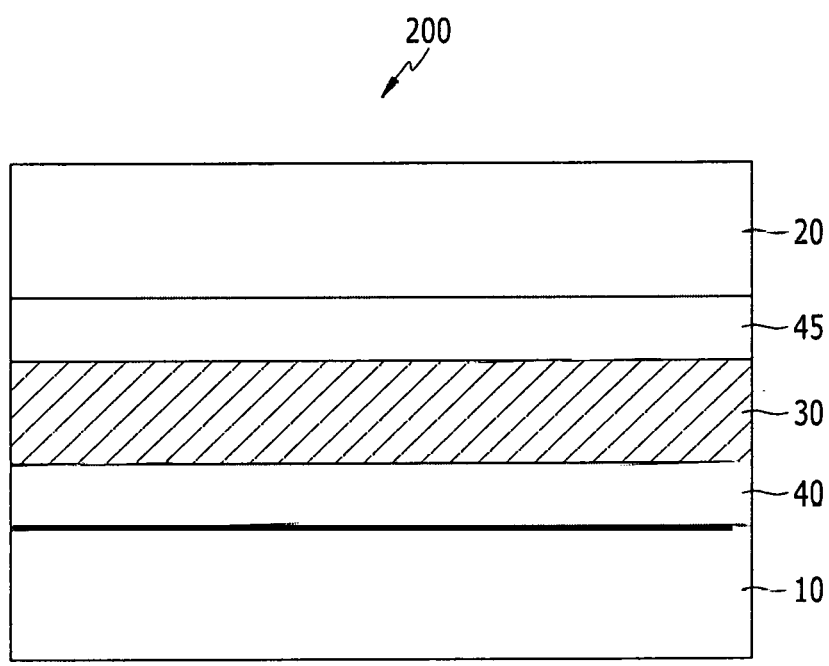
FIG. 2 is a cross-sectional view showing an optoelectronic device according to example embodiments.
Figure 3:
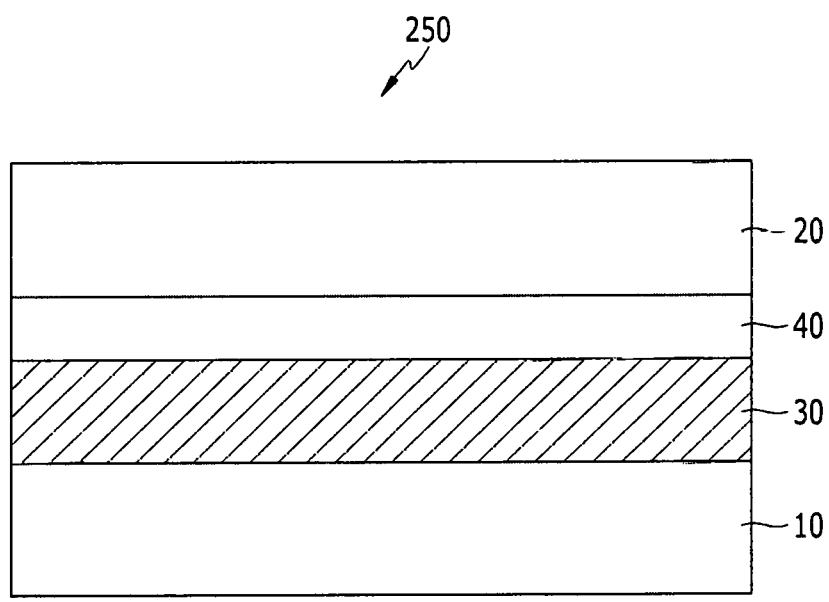
FIG. 3 is a cross-sectional view showing an optoelectronic device according to example embodiments.

FIG. 1 is a cross-sectional view showing an optoelectronic device according to example embodiments, FIG. 2 is a cross-sectional view showing an optoelectronic device according to example embodiments, and FIG. 3 is a cross-sectional view showing an optoelectronic device according to example embodiments.

Referring to FIG. 1, an optoelectronic device 100 according to example embodiments includes a first electrode 10 and a second electrode 20 facing each other, a photoelectric conversion layer 30 between the first electrode 10 and the second electrode 20, and a first buffer layer 40 between the first electrode 10 and the photoelectric conversion layer 30.

Referring to FIG. 2, an optoelectronic device 200 according to example embodiments includes a first electrode 10 and a second electrode 20 facing each other, a photoelectric conversion layer 30 between the first electrode 10 and the second electrode 20, a first buffer layer 40 between the first electrode 10 and the photoelectric conversion layer 30, and a second buffer layer 45 between the second electrode 20 and the photoelectric conversion layer 30.

Referring to FIG. 3, an optoelectronic device 250 according to example embodiments includes a first electrode 10 and a second electrode 20 facing each other, a photoelectric conversion layer 30 between the first electrode 10 and the second electrode 20, and a first buffer layer 40 between the second electrode 20 and the photoelectric conversion layer 30.

A substrate (not shown) may be disposed on a side of the first electrode 10 and a side of the second electrode 20. The substrate may be, for example, made of an inorganic material (e.g., glass), an organic material (e.g., polycarbonate, polymethylmethacrylate, polyethylene terephthalate, polyethylene naphthalate, polyamide, polyethersulfone, or a combination thereof), or a silicon wafer.

One of the first electrode 10 and second electrode 20 may be an anode and the other may be a cathode. For example, the first electrode 10 may be a cathode and the second electrode 20 may be an anode.

At least one of the first electrode 10 and the second electrode 20 may be a light-transmitting electrode.

In example embodiments, the first electrode 10 may include one of a first metal, a first metal oxide, and a combination thereof, and the second electrode 20 may include one of a second metal, a second metal oxide, and a combination thereof.

The first metal of the first electrode 10 may include at least one selected from silver (Ag), aluminum (Al), copper (Cu), gold (Au), and an alloy thereof, and the first metal oxide may include at least one selected from indium tin oxide (ITO), indium zinc oxide (IZO), zinc oxide (ZnO), tin oxide (SnO), aluminum tin oxide (AlTO), and fluorine-doped tin oxide (FTO).

The second metal of the second electrode 20 may include at least one selected from silver (Ag), aluminum (Al), copper (Cu), gold (Au), and an alloy thereof, and the second metal oxide may include at least one selected from molybdenum oxide, tungsten oxide, vanadium oxide, rhenium oxide, niobium oxide, tantalum oxide, titanium oxide, zinc oxide, nickel oxide, copper oxide, cobalt oxide, manganese oxide, chromium oxide, indium oxide, or a combination thereof.

The photoelectric conversion layer 30 includes a p-type semiconductor and n-type semiconductor to form a pn junction, and externally receives light, produces excitons, and separates the excitons into holes and electrons. The p-type semiconductor and the n-type semiconductor may include an organic material, an inorganic material, or a combination thereof.

The photoelectric conversion layer 30 may include an intrinsic layer including both a p-type semiconductor and an n-type semiconductor, and may be formed, for example, using a codeposition method.

The photoelectric conversion layer 30 may further include at least one selected from a p-type layer and an n-type layer along with the intrinsic layer. The p-type layer includes a p-type semiconductor and the n-type layer includes an n-type semiconductor.

The p-type semiconductor may include, for example, N,N'-dimethyl-quinacridone (DMQA), diindenoperylene, and dibenzo{[f,f']-4,4',7,7'-tetraphenyl}diindeno[1,2,3-cd:1',2',3'-lm]perylene, but is not limited thereto. The n-type semiconductor may include, for example, dicyanovinyl-terthiophene (DCV3T), subphthalocyane (SubPc), fullerene, a fullerene derivative, and perylene diimide, but is not limited thereto.

The first buffer layer 40 may be present between the first electrode 10 and the photoelectric conversion layer 30 and thereby, when the first electrode 10 is a cathode, the first electrode 10 may function as a hole blocking layer (HBL).

The second buffer layer 45 may be present between the second electrode 10 and the photoelectric conversion layer 30, and thereby, when the second electrode 20 is an anode, the second electrode 20 may function as an electron blocking layer (EBL).

The first buffer layer 40 and the second buffer layer 45 may independently include an inorganic oxide selected from $MoO_{x1}$ ($2.58 \leq x1 < 3.0$), $ZnO_{x2}$ ($1.0 \leq x2 < 2.0$), $TiO_{x3}$ ($1.5 \leq x3 < 2.0$), $VO_{x4}$ ($1.5 \leq x4 < 2.0$), $TaO_{x5}$ ($1.0 \leq x5 < 2.5$), $WO_{x6}$ ($2.0 < x6 < 3.0$), and a combination thereof. The first buffer layer 40 and second buffer layer 45 may independently include an inorganic oxide selected from $MoO_{x1}$ ($2.62 \leq x1 \leq 2.9$), $ZnO_{x2}$ ($1.0 \leq x2 \leq 1.9$), $TiO_{x3}$ ($1.5 \leq x3 \leq 1.9$), $VO_{x4}$ ($1.5 \leq x4 \leq 1.9$), $TaO_{x5}$ ($1.0 \leq x5 \leq 2.4$), $WO_{x6}$ ($2.1 \leq x6 \leq 2.9$), and a combination thereof. The x1 to x6 allow for the inorganic oxide in a state of an oxygen vacancy defect and to secure an appropriate dark current. When the x1 to x6 are larger than the upper limit, the dark current may be increased. When the x1 to x6 are smaller than the lower limit, a charge (an electron or a hole) may not be efficiently blocked.

The x1 to x6 may be verified through a composition ratio analysis, for example, XPS (X-ray photoelectron spectroscopy), AES (Auger electron spectroscopy), and RBS (Rutherford backscattering spectrometry).

The first buffer layer 40 and the second buffer layer 45 may each have a thickness of about 1 nm to about 100 nm. The first buffer layer 40 and the second buffer layer 45 each having a thickness within the range may secure photoelectric conversion efficiency of greater than or equal to about 70% with reference to about 3 V and about 540 nm, and show a dark current of less than or equal to about 100 e/s.

The first buffer layer 40 and the second buffer layer 45 may control a stoichiometric ratio between a metal selected from Mo, Zn, Ti, V, Ta, and W and oxygen, and thus make the inorganic oxide including the metal in a state of an oxygen vacancy defect.

In this way, the first buffer layer 40 having the oxygen vacancy defect as a relatively low valence band may play a role of a hole blocking layer blocking a hole from being transferred from the photoelectric conversion layer 30 to the first electrode. In addition, the second buffer layer 45 having the oxygen vacancy defect as a relatively high conduction band may play a role of an electron blocking layer blocking transportation of an electron from the photoelectric conversion layer 30 to the second electrode.

When the first electrode 10 is a cathode, the optoelectronic devices 100 and 200 may further include a third buffer layer (not shown) selected from an electron injection layer (EIL) promoting injection of electrons in order to facilitate movement of the electrons separated from the photoelectric conversion layer 30, and an electron transporting layer (ETL) promoting transportation of the electrons and a combination thereof between the first electrode 10 and the photoelectric conversion layer 30.

In addition, when the second electrode 20 is an anode, the optoelectronic device may further include a fourth buffer layer (not shown) selected from a hole injection layer (HIL) promoting injection of holes separated from the photoelectric conversion layer 30 in order to facilitate movement of the holes, a hole transport layer (HTL) promoting transportation of the holes, and a combination thereof between the second electrode 20 and the photoelectric conversion layer 30.

The electron transport layer (ETL) may include one selected from, for example, 1,4,5,8-naphthalene-tetracarboxylic dianhydride (NTCDA), bathocuproine (BCP), LiF, Alq3, Gaq3, Inq3, Znq2, Zn(BTZ)2, BeBq2, aluminum (Al), magnesium (Mg), molybdenum (Mo), aluminum oxide, magnesium oxide, molybdenum oxide, and a combination thereof, but is not limited thereto.

The hole transport layer (HTL) may include one selected from, for example, poly(3,4-ethylenedioxythiophene):poly(styrene sulfonate) (PEDOT:PSS), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA, 4,4',4''-tris(N-carbazolyl)-triphenylamine (TCTA), tungsten oxide ($WO_x$, $0<x\leq3$), molybdenum oxide ($MO_x$, $1<x<3$), vanadium oxide ($V_2O_5$), rhenium oxide, nickel oxide ($NiO_x$, $1<x<4$), copper oxide, titanium oxide, molybdenum sulfide, and a combination thereof, but is not limited thereto.

A method of manufacturing the optoelectronic device is provided.

The method of manufacturing the optoelectronic device according to example embodiments includes providing a first electrode, depositing an inorganic oxide selected from molybdenum oxide, zinc oxide, titanium oxide, vanadium oxide, tantalum oxide, tungsten oxide, and a combination thereof followed by oxygen plasma treatment to provide a first buffer layer, stacking a photoelectric conversion layer and a second electrode sequentially on the first buffer layer.

The manufacturing method may further include depositing an inorganic oxide selected from molybdenum oxide, zinc oxide, titanium oxide, vanadium oxide, tantalum oxide, tungsten oxide, and a combination thereof on the photoelectric conversion layer followed by oxygen plasma treatment to provide a second buffer layer, and stacking the second electrode thereon.

A method of manufacturing the optoelectronic device according to example embodiments includes providing a first electrode, providing a photoelectric conversion layer on the first electrode, depositing an inorganic oxide selected from molybdenum oxide, zinc oxide, titanium oxide, vanadium oxide, tantalum oxide, tungsten oxide, and a combination thereof on the photoelectric conversion layer followed by oxygen plasma treatment to provide a second buffer layer, providing a second electrode on the second buffer layer.

The inorganic oxide is mainly formed through thermal deposition, and an inorganic oxide layer resultantly formed thereof may include an undesirable number of oxygen vacancies and thus may increase dark current of an optoelectronic device. This increased dark current may be a more serious problem in an organic optoelectronic device including a photoelectric conversion layer formed by using an organic material. Accordingly, the method of manufacturing the optoelectronic device includes plasma-treating the inorganic oxide under an oxygen gas atmosphere after the deposition to adjust a stoichiometric ratio between metal and oxygen within a predetermined or given range.

The plasma treatment may use inductively coupled plasma (ICP), but is not limited thereto.

The plasma treatment may be performed for about 30 seconds to about 3 hours, for example for about 30 seconds to about 1.5 hours. Herein, a gas flow rote may be adjusted within a range of about 10 sccm to about 200 sccm, for example about 50 sccm to about 150 sccm. In addition, power supply may be adjusted in a range of about 20 W to about 200 W, for example about 50 W to about 150 W. When the gas flow rate and the power supply are respectively within the above ranges, the stoichiometric ratio between metal and oxygen may be adjusted within a desired range.

The first buffer layer 40 and the second buffer layer 45 may have surface roughness ranging from about 0.2 to about 20 nm. The first and second buffer layers 40 and 45 having surface roughness within the range may have improved junction and light transmittance characteristics with the photoelectric conversion layer 30.

In addition, the deposition process and the oxygen plasma treatment process may be alternately performed to obtain a desired thin film thickness. The number of repetitions of the processes may be changed depending on a thickness of a thin film but may range from about 3 to about 10 times.

The optoelectronic device may be applied to a light emitting diode, an image sensor, a photosensor, a photo-detector, and a solar cell, without limitation. The optoelectronic device may be an organic optoelectronic device, and may be, for example, applied to an organic light emitting diode (OLED), an organic image sensor, an organic photosensor, an organic photo-detector, or an organic solar cell.

Hereinafter, an example of an image sensor including the optoelectronic device is described referring to drawings. As an example of an image sensor, an organic CMOS image sensor is described.

Figure 4:
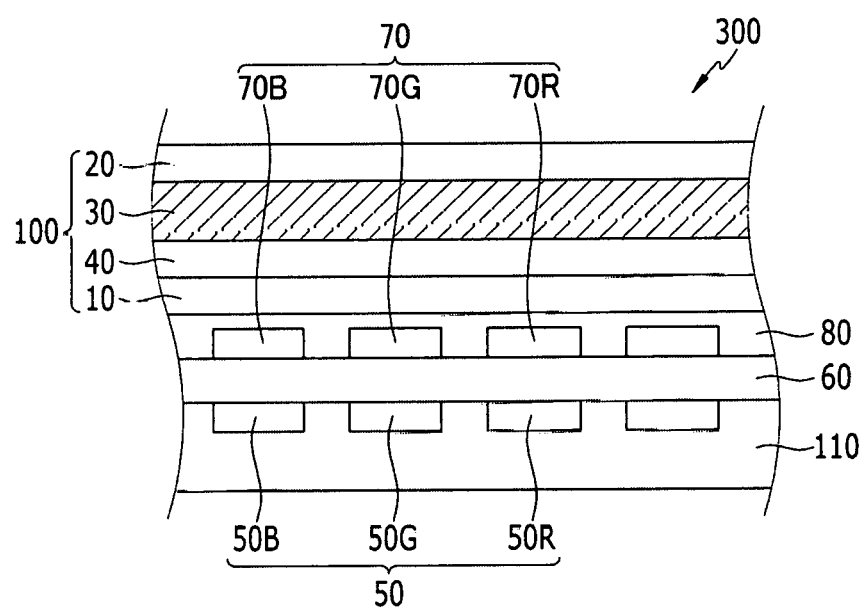
FIG. 4 is a cross-sectional view showing an organic CMOS image sensor according to example embodiments.

FIG. 4 is a cross-sectional view showing an organic CMOS image sensor according to example embodiments.

FIG. 4 shows a blue pixel, a green pixel, and a red pixel that are adjacent to each other, but this is not limiting. Hereinafter, a constituent element including "B" in the reference numeral refers to a constituent element included in the blue pixel, a constituent element including "G" in the reference numeral refers to a constituent element included in the green pixel, and a constituent element including "R" in the reference numeral refers to a constituent element included in the red pixel.

Referring to FIG. 4, a CMOS image sensor 300 according to example embodiments includes a semiconductor substrate 110 integrated with a photo-sensing device 50, and a transmission transistor (not shown), a lower insulation layer 60, color filters 70B, 70G, and 70R, an upper insulation layer 80, and an optoelectronic device 100.

The semiconductor substrate 110 may be a silicon substrate, and is integrated with the photo-sensing device 50 and transmission transistor (not shown). The photo-sensing device 50 may be a photodiode. The photo-sensing device 50 and the transmission transistor 55 may be integrated in each pixel, and as shown in the drawing, the photo-sensing device 50 may include a photo-sensing device 50B of a blue pixel, a photo-sensing device 50G of a green pixel, and a photo-sensing device 50R of a red pixel. The photo-sensing device 50 senses light, and the information sensed by the photo-sensing device 50 may be transferred by the transmission transistor.

A metal wire (not shown) and a pad (not shown) are formed on the semiconductor substrate 110. In order to decrease signal delay, the metal wire and pad may be made of a metal having relatively low resistivity, for example, aluminum (Al), copper (Cu), silver (Ag), and alloys thereof, but are not limited thereto.

The lower insulation layer 60 is formed on the metal wire and the pad. The lower insulation layer 60 may be made of an inorganic insulating material (e.g., a silicon oxide and/or a silicon nitride), or a low dielectric constant (low K) material (e.g., SiC, SiCOH, SiCO, and SiOF).

The lower insulation layer 60 has a trench (not shown) exposing the photo-sensing devices 50B, 50G, and 50R. The trench may be filled with fillers.

A color filter layer 70 is formed on the lower insulation layer 60. The color filter layer 70 includes a blue filter 70B formed in the blue pixel, a green filter 70G formed in the green pixel, and a red filter 70R filled in the red pixel. The upper insulation layer 80 is formed on the color filter layer 70. The upper insulation layer 80 eliminates a step caused by the color filter layer 70 and smoothes the surface. The optoelectronic device 100 is formed on upper insulation layer 80.

As described above, the optoelectronic device 100 includes a first electrode 10 and a second electrode 20 facing each other, a photoelectric conversion layer 30 between the first electrode 10 and the second electrode 20, and a first buffer layer 40 between the first electrode 10 and the photoelectric conversion layer 30. The drawing shows an example in which the first electrode 10 is disposed on the upper insulation layer 80, but the second electrode 20 may be positioned on the upper insulation layer 80.

Both the first electrode 10 and the second electrode 20 may be, for example, a light transmission electrode, and the photoelectric conversion layer 30 may include an organic material absorbing light of the visible ray region.

The light incident from the first electrode 10 or the second electrode 20 may be photoelectrically converted at the photoelectric conversion layer 30, may be passed through the first electrode 10 or the second electrode 20, and may be sensed by a photo-sensing device 50.

According to example embodiments, a CMOS image sensor 300 includes the above optoelectronic device 100, and thus may increase charge mobility between the electrodes 10 and 20 and the photoelectric conversion layer 30 and secure photoelectric conversion efficiency (EQE), and simultaneously decrease a dark current resulting in reduced noise and improved performance.

The CMOS image sensor 300 of FIG. 4 may include the optoelectronic device 200 of FIG. 2 instead of the optoelectronic device 100 of FIG. 1.

Figure 5:
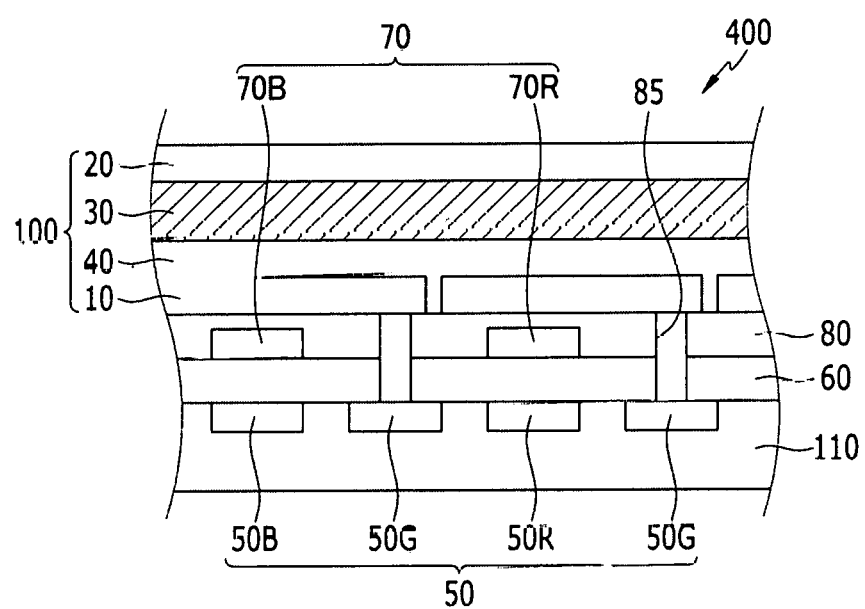
FIG. 5 is a cross-sectional view showing an organic CMOS image sensor according to example embodiments.

FIG. 5 is a cross-sectional view showing an organic CMOS image sensor according to example embodiments.

The organic CMOS image sensor 400 according to example embodiments includes a semiconductor substrate 110 integrated with a photo-sensing device 50, and a transmission transistor (not shown), a lower insulation layer 60, a color filter 70, an upper insulation layer 80, and a photoelectronic device 100, as above.

However, the organic CMOS image sensor 200 according to example embodiments may omit the green filter 70G, different from the example embodiment illustrated in FIG. 4, and instead may substitute the photoelectric conversion layer 30 of the photoelectronic device 100 for the green filter 70G. The photoelectric conversion layer 30 of the photoelectronic device 100 may include, for example, an organic material mainly adsorbing light in a green wavelength region, and the light incident from the light transmission metal electrode may be photoelectrically converted by mainly adsorbing light in the green wavelength region at the photoelectric conversion layer 30, while light in the other wavelength regions is passed through the first electrode 10 or the second electrode 20 and sensed by a photo-sensing device 50. The upper insulation layer 80 and lower insulation layer 60 have through-holes 85 to expose a photo-sensing device 50G of a green pixel.

However, when the photoelectric conversion layer 30 of the photoelectronic device 100 includes an organic material that mainly absorbs light of a red wavelength region and an organic material that mainly absorbs light of a blue wavelength region, a red filter 70R or a blue filter 70B may be substituted with the photoelectric conversion layer 30.

The CMOS image sensor 400 of FIG. 5 may include the optoelectronic device 200 shown in FIG. 2 instead of the optoelectronic device 100 shown in FIG. 1.

The image sensor includes a semiconductor substrate integrated with a plurality of first photo-sensing devices sensing light in a blue wavelength region, a plurality of second photo-sensing devices sensing light in a red wavelength region, and a third photo-sensing device positioned on the semiconductor substrate and selectively absorbing light in a green wavelength region, wherein at least one of the first photo-sensing device, the second photo-sensing device, and the third photo-sensing device may include the optoelectronic device.

The image sensor may further include a color filter layer including a blue filter selectively absorbing light in a blue wavelength region and a red filter selectively absorbing light in a red wavelength region, between the semiconductor substrate and the third photo-sensing device.

Figure 6:
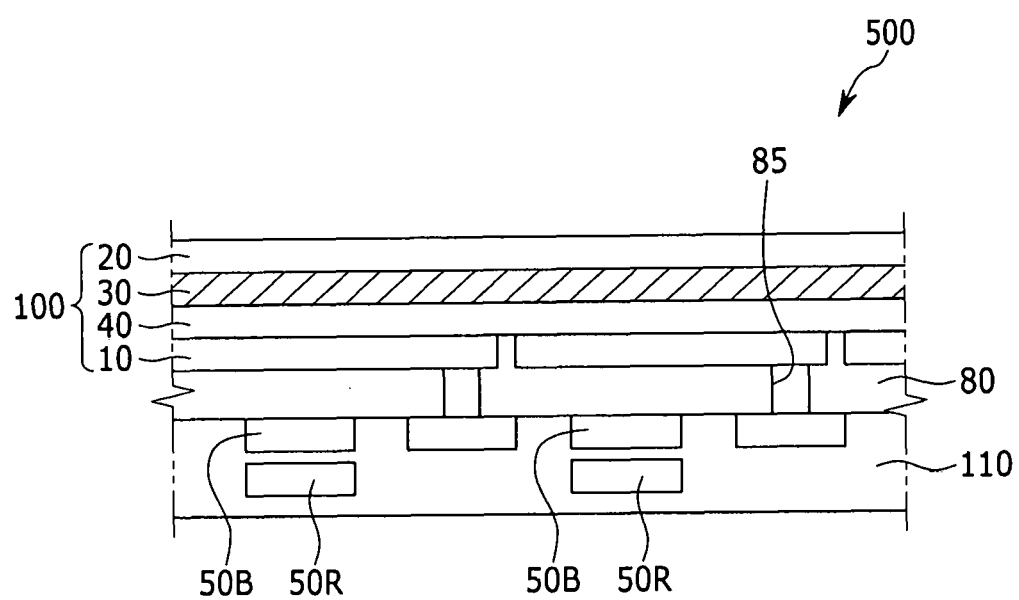
FIG. 6 is a schematic cross-sectional view showing an organic CMOS image sensor according to example embodiments.

Referring to FIG. 6, the CMOS image sensor 500 may include the first photo-sensing device 50B and the second photo-sensing device 50R stacked in a vertical direction in the semiconductor substrate.

Figure 7:
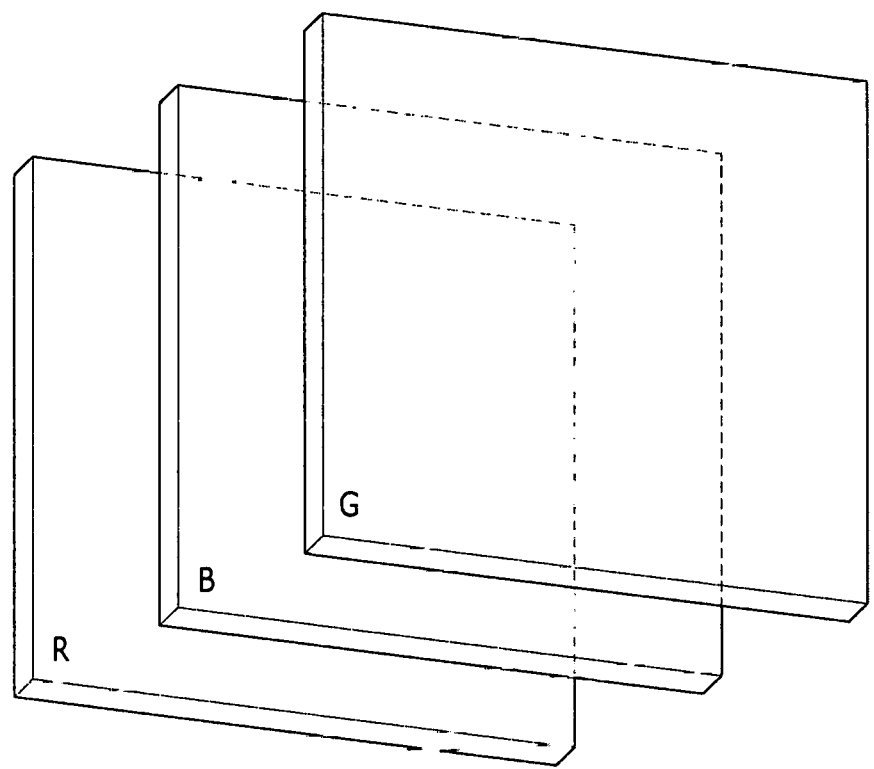
FIG. 7 is a schematic view showing an organic CMOS image sensor according to example embodiments.

Referring to FIG. 7, a green photoelectric device (G) selectively absorbing light in a green wavelength region, a blue photoelectric device (B) selectively absorbing light in a blue wavelength region, and a red photoelectric device (R) selectively absorbing light in a red wavelength region may be stacked.

According to example embodiments, an electronic device includes the image sensor.

The electronic device may be, for example, a mobile phone, a digital camera, and a biosensor, but is not limited thereto.

Hereinafter, the present disclosure is illustrated in more detail with reference to examples. However, these are examples, and the present disclosure is not limited thereto.

Manufacture of Optoelectronic Device

Comparative Example 1

A 150 nm-thick first electrode is formed on a glass substrate by sputtering ITO. Subsequently, a 10 nm-thick first buffer layer is formed by thermally depositing molybdenum oxide ($MoO_x$, x=2.56) on the first electrode. The x is verified through an AES (Auger electron spectroscopy) analysis. On the first buffer layer, an 80 nm-thick photoelectric conversion layer is formed by co-depositing SubPC (a p-type semiconductor) and C60 (an n-type semiconductor) in a volume ratio of 1:1. On the photoelectric conversion layer, a 7 nm-thick second electrode is formed by thermally depositing ITO, manufacturing an organic optoelectronic device.

Comparative Example 2

A 150 nm-thick first electrode is formed on a glass substrate by sputtering ITO. Subsequently, a 10 nm-thick first buffer layer is formed by thermally depositing molybdenum oxide MoOx (x=2.38) on the first electrode and plasma-treating it for 60 minutes under an argon atmosphere. The x is verified through an AES (Auger electron spectroscopy) analysis. Herein, power is 100 W, and a gas flow rate is set to be 100 sccm. On the first buffer layer, an 80 nm-thick photoelectric conversion layer is formed by thermally codepositing SubPC (a p-type semiconductor) and C60 (an n-type semiconductor) in a volume ratio of 1:1. Subsequently, a 7 nm-thick second electrode is formed by thermally depositing ITO on the photoelectric conversion layer, manufacturing an optoelectronic device.

Example 1

A 150 nm-thick first electrode is formed on a glass substrate by sputtering ITO. Subsequently, a 10 nm-thick first buffer layer including MoOx (x=2.62) is formed by thermally depositing molybdenum oxide on the first electrode and plasma-treating it under an oxygen atmosphere for 5 minutes. The x is verified through an AES (Auger electron spectroscopy) analysis. Herein, power is 100 W, and a gas flow rate is set to be 100 sccm. On the first buffer layer, an 80 nm-thick photoelectric conversion layer is formed by codepositing SubPC (a p-type semiconductor) and C60 (an n-type semiconductor) in a volume ratio of 1:1. Subsequently, on the photoelectric conversion layer, a 7 nm-thick second electrode is formed by thermally depositing ITO, manufacturing an optoelectronic device.

Example 2

A 150 nm-thick first electrode is formed on a glass substrate by sputtering ITO. Subsequently, a 10 nm-thick first buffer layer including MoOx (x=2.78) is formed by thermally depositing molybdenum oxide on the first electrode and plasma-treating it under an oxygen atmosphere for 60 minutes. The x is verified through an AES (Auger electron spectroscopy) analysis. Herein, power is 100 W, and a gas flow idle is set to be 100 sccm. On the first buffer layer, an 80 nm-thick photoelectric conversion layer is formed by codepositing SubPC (a p-type semiconductor) and C60 (an n-type semiconductor) in a volume ratio of 1:1. Subsequently, a 7 nm-thick second electrode is formed by thermally depositing ITO on the photoelectric conversion layer, manufacturing an optoelectronic device.

Figure 8:
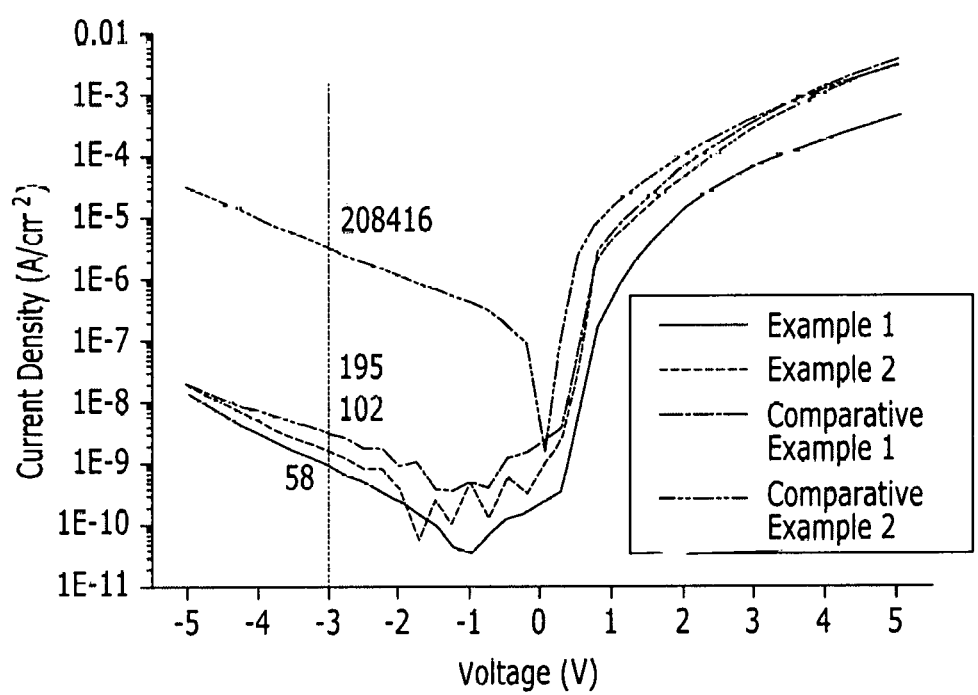
FIG. 8 is a graph showing current density of the optoelectronic devices according to Comparative Examples 1 and 2 and Examples 1 and 2 depending on a voltage.

Current densities of the optoelectronic devices according to Comparative Examples 1 and 2 and Examples 1 and 2 depending on a voltage are respectively measured, and the results are provided in FIG. 8. FIG. 8 is a graph showing the current density of each of the optoelectronic devices according to Comparative Examples 1 and 2 and Examples 1 and 2 depending on a voltage. In FIG. 8, a numerical value indicates a dark current value at −3 V. Referring to FIG. 8, the optoelectronic devices according to Examples 1 and 2 respectively show deteriorated dark currents of 58 e/s and 102 e/s at −3 V compared with the optoelectronic device according to Comparative Example 1, and the optoelectronic device according to Comparative Example 2 shows increased dark current.

Figure 9:
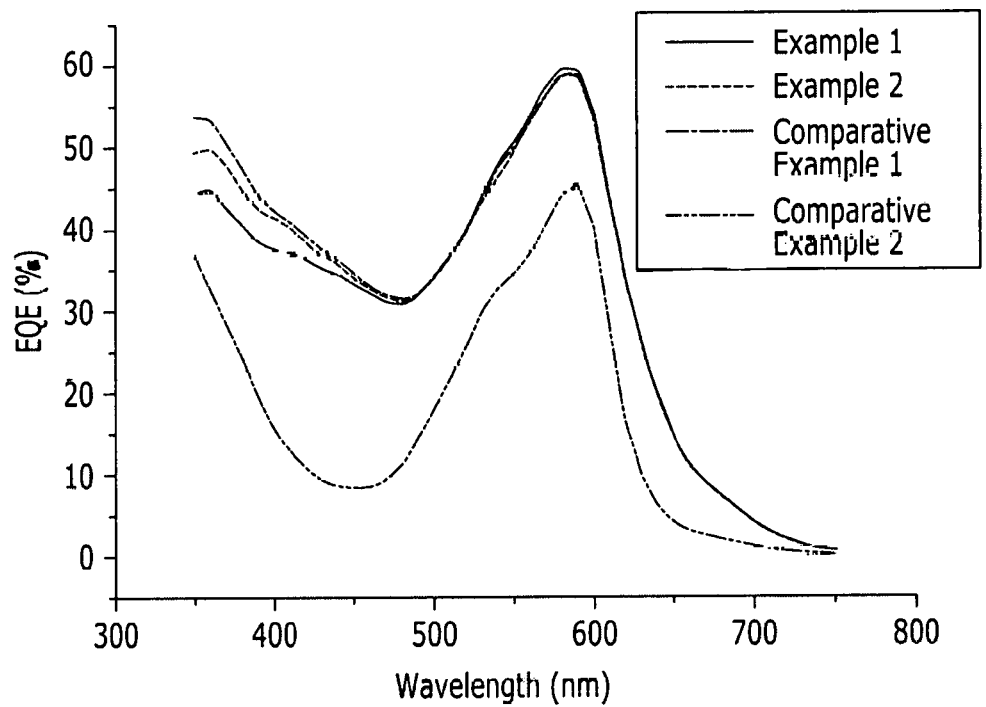
FIG. 9 is a graph showing external quantum efficiency of the optoelectronic devices according to Comparative Examples 1 and 2 and Examples 1 and 2 depending on a wavelength.

External quantum efficiencies of the optoelectronic devices according to Comparative Examples 1 and 2 and Examples 1 and 2 depending on a wavelength are measured and provided in FIG. 9. FIG. 9 is a graph showing the external quantum efficiency of each of the optoelectronic devices according to Comparative Examples 1 and 2 and Examples 1 and 2 depending on a wavelength. Referring to FIG. 9, the optoelectronic devices according to Examples 1 and 2 show equivalent external quantum efficiency in a green region to that of the optoelectronic device according to Comparative Example 1, and thus the external quantum efficiency of the optoelectronic devices according to Examples 1 and 2 turn out to have little influence due to the first buffer layer. On the contrary, the optoelectronic device of Comparative Example 2 shows deteriorated external quantum efficiency.

While this disclosure has been described in connection with what is presently considered to be practical example embodiments, it is to be understood that the inventive concepts are not limited to the disclosed embodiments, but, on the contrary, is intended to cover various modifications and equivalent arrangements included within the spirit and scope of the appended claims.

What is claimed is:

1. An optoelectronic device comprising:
    a cathode and an anode facing each other;
    a photoelectric conversion layer between the cathode and the anode; and
    a hole blocking layer between the photoelectric conversion layer and the cathode, the hole blocking layer consisting of $MoO_{x1}$ ($2.58 \leq x1 < 3.0$), $TiO_{x3}$ ($1.5 \leq x3 < 2.0$), $VO_{x4}$ ($1.5 \leq x4 < 2.0$), $TaO_{x5}$ ($1.0 \leq x5 < 2.5$), $WO_{x6}$ ($2.0 < x6 < 3.0$), or a combination thereof.

2. The optoelectronic device of claim 1, wherein the hole blocking layer has a thickness of about 1 nm to about 100 nm.

3. The optoelectronic device of claim 1, wherein at least one of the cathode and the anode is a light-transmitting electrode.

4. The optoelectronic device of claim 1, wherein
    the cathode includes one of a first metal, a first metal oxide, and a combination thereof, and
    the anode includes one of a second metal, a second metal oxide, and a combination thereof.

5. A method of manufacturing an optoelectronic device, comprising:
    forming a hole blocking layer on a cathode including,
        depositing an inorganic oxide on the cathode, the inorganic oxide including one of molybdenum oxide, zinc oxide, titanium oxide, vanadium oxide, tantalum oxide, tungsten oxide, and a combination thereof, and
        performing an oxygen plasma treatment on the resulting cathode; and
    sequentially stacking a photoelectric conversion layer and an anode on the hole blocking layer,
    wherein the hole blocking layer consists of $MoO_{x1}$ ($2.62 \leq x1 \leq 2.9$), $TiO_{x3}$ ($1.5 \leq x3 \leq 1.9$), $VO_{x4}$ ($1.5 \leq x4 \leq 1.9$), $TaO_{x5}$ ($1.0 \leq x5 \leq 2.4$), $WO_{x6}$ ($2.1 \leq x6 \leq 2.9$), or a combination thereof.

6. The method of claim 5, wherein prior to the stacking an anode, further comprising:

forming an electron blocking layer on the photoelectric conversion layer including,
depositing an inorganic oxide on the photoelectric conversion layer, the inorganic oxide including one of molybdenum oxide, zinc oxide, titanium oxide, vanadium oxide, tantalum oxide, tungsten oxide, and a combination thereof, and
performing an oxygen plasma treatment on the resulting photoelectric conversion layer.

7. A method of manufacturing an optoelectronic device, comprising:
forming a photoelectric conversion layer on a cathode;
forming a hole blocking layer on the photoelectric conversion layer including,
depositing an inorganic oxide on the photoelectric conversion layer, the inorganic oxide including one of molybdenum oxide, zinc oxide, titanium oxide, vanadium oxide, tantalum oxide, tungsten oxide, and a combination thereof, and
performing an oxygen plasma treatment on the resulting photoelectric conversion layer; and
forming an anode on the hole blocking layer,
wherein the hole blocking layer consists of $MoO_{x1}$ ($2.62 \leq x1 \leq 2.9$), $TiO_{x3}$ ($1.5 \leq x3 \leq 1.9$), $VO_{x4}$ ($1.5 \leq x4 \leq 1.9$), $TaO_{x5}$ ($1.0 \leq x5 \leq 2.4$), $WO_{x6}$ ($2.1 \leq x6 \leq 2.9$), or a combination thereof.

8. The method of claim 5, wherein the performing performs the oxygen plasma treatment for about 30 seconds to about 3 hours.

9. The method of claim 5, wherein the performing performs the oxygen plasma treatment having a gas flow rate adjusted to be in a range of about 10 sccm to about 200 sccm.

10. The method of claim 5, wherein the performing performs the oxygen plasma treatment having a supplied power adjusted to be in a range of about 20 W to 200 W.

11. The method of claim 5, wherein the depositing and performing are repeated at least once.

12. An image sensor comprising the optoelectronic device of claim 1.

13. The image sensor of claim 12, further comprising:
a semiconductor substrate integrated with a plurality of first photo-sensing devices sensing light in a blue wavelength region and a plurality of second photo-sensing devices sensing light in a red wavelength region; and
a third photo-sensing device on the semiconductor substrate, the third photo-sensing device selectively absorbing light in a green wavelength region,
wherein at least one of the plurality of first photo-sensing devices, the plurality of second photo-sensing devices, and the third photo-sensing device includes the optoelectronic device.

14. The image sensor of claim 13, further comprising:
a color filter layer between the semiconductor substrate and the third photo-sensing device, the color filter layer including a blue filter selectively absorbing light in the blue wavelength region and a red filter selectively absorbing light in the red wavelength region.

15. The image sensor of claim 13, wherein the plurality of first photo-sensing devices and the plurality of second photo-sensing devices are stacked in a vertical direction on the semiconductor substrate.

16. The image sensor of claim 12, wherein a green photoelectric device selectively absorbing light in the green wavelength region, a blue photoelectric device selectively absorbing light in the blue wavelength region, and a red photoelectric device selectively absorbing light in the red wavelength region are stacked.

17. An electronic device comprising the image sensor of claim 12.

* * * * *